United States Patent
Klüßendorf et al.

(10) Patent No.: US 12,067,886 B2
(45) Date of Patent: Aug. 20, 2024

(54) DEVICE FOR PRODUCING A FLIGHT PLAN FOR LIGHTWEIGHT AIRCRAFT

(71) Applicant: Aalto Haps Limited, Stevenage (GB)

(72) Inventors: Fabian Klüßendorf, Taufkirchen (DE); Paul Stevens, Stevenage (GB); Steve Tate, Stevenage (GB)

(73) Assignee: Aalto Haps Limited, Stevenage (GB)

( * ) Notice: Subject to any disclaimer, the term of this patent is extended or adjusted under 35 U.S.C. 154(b) by 391 days.

(21) Appl. No.: 17/433,290

(22) PCT Filed: Feb. 26, 2020

(86) PCT No.: PCT/EP2020/054955
§ 371 (c)(1),
(2) Date: Aug. 24, 2021

(87) PCT Pub. No.: WO2020/173971
PCT Pub. Date: Sep. 3, 2020

(65) Prior Publication Data
US 2022/0148441 A1    May 12, 2022

(30) Foreign Application Priority Data
Feb. 26, 2019  (DE) ............... 10 2019 104 795.1

(51) Int. Cl.
*G08G 5/00*      (2006.01)
*G06F 30/20*     (2020.01)

(52) U.S. Cl.
CPC ........... *G08G 5/0034* (2013.01); *G06F 30/20* (2020.01)

(58) Field of Classification Search
CPC .. G08G 5/0034; G08G 5/0026; G08G 5/0039; G08G 5/0052; G08G 5/006;
(Continued)

(56) References Cited

U.S. PATENT DOCUMENTS 5,757,322 A * 5/1998 Ray ................... G01W 1/16
                                              342/26 D
8,165,790 B2 * 4/2012 Bailey ................ G08G 5/0013
                                              340/901
(Continued)

FOREIGN PATENT DOCUMENTS

CN   107918683 A *  4/2018  ............. G06F 19/00
DE   102014117526 A1  6/2015
WO   2014020596 A1  2/2014

OTHER PUBLICATIONS

International Search Report including Written Opinion for PCT/EP2020/054955 mailed Jun. 16, 2020; 19 pages.
(Continued)

*Primary Examiner* — Redhwan K Mawari
(74) *Attorney, Agent, or Firm* — Lerner David LLP

(57) ABSTRACT

A device is specified for producing a flight plan for lightweight aircraft. The device includes a first interface, a second interface, and a processing unit. The first interface is configured to receive aircraft data relating to the lightweight aircraft, wherein the aircraft data at least contain flight properties and functions of the lightweight aircraft. The second interface is configured to receive weather data from a weather information source, wherein the weather data contain at least weather data from the past and contain at least air movements in an altitude profile between a maximum altitude of the lightweight aircraft and the Earth's surface. The processing unit is configured to compare the aircraft data to the weather data and to ascertain whether the lightweight aircraft is manoeuvrable in the case of the received weather data and on the basis of the aircraft data.

10 Claims, 2 Drawing Sheets

(58) Field of Classification Search
CPC .. G08G 5/0069; G08G 5/0091; G08G 5/0013; G06F 30/20
See application file for complete search history.

(56) References Cited

U.S. PATENT DOCUMENTS

| | | | |
|---|---|---|---|
| 8,588,821 B1* | 11/2013 | Hewinson | G06Q 10/04 340/687 |
| 9,710,218 B2 | 7/2017 | Khatwa et al. | |
| 2002/0039072 A1* | 4/2002 | Gremmert | G08G 5/0052 340/963 |
| 2011/0054718 A1* | 3/2011 | Bailey | G08G 5/0021 701/3 |
| 2013/0231803 A1 | 9/2013 | Barraci et al. | |
| 2014/0039733 A1 | 2/2014 | Ren et al. | |
| 2014/0081569 A1* | 3/2014 | Agrawal | G08G 5/0091 701/467 |
| 2016/0011839 A1* | 1/2016 | Khatwa | G01S 7/24 345/7 |
| 2016/0055752 A1 | 2/2016 | McCann et al. | |
| 2016/0155338 A1 | 6/2016 | Lynar et al. | |
| 2016/0225263 A1 | 8/2016 | Salentiny et al. | |
| 2016/0232797 A1 | 8/2016 | Wiesemann et al. | |
| 2016/0260331 A1 | 9/2016 | Salentiny et al. | |
| 2016/0293017 A1 | 10/2016 | Whelan | |
| 2017/0025900 A1* | 1/2017 | Amari | H02J 50/12 |
| 2017/0039862 A1 | 2/2017 | Choi et al. | |
| 2017/0082745 A1* | 3/2017 | Kronfeld | G01S 13/953 |
| 2018/0017976 A1 | 1/2018 | Bash et al. | |
| 2018/0061251 A1 | 3/2018 | Venkatraman et al. | |
| 2018/0141656 A1* | 5/2018 | Heinonen | B64C 39/024 |
| 2018/0238996 A1* | 8/2018 | Gurusamy | G08G 5/0052 |
| 2018/0247547 A1* | 8/2018 | Karunakar | G08G 5/003 |
| 2020/0193843 A1* | 6/2020 | Candido | G08G 5/0047 |

OTHER PUBLICATIONS

International Search Report for Application No. PCT/EP2020/054801, mailing Jun. 17, 2020, 13 pages.
Co-pending U.S. Appl. No. 17/433,296, filed Aug. 24, 2021.

* cited by examiner

DEVICE FOR PRODUCING A FLIGHT PLAN FOR LIGHTWEIGHT AIRCRAFT

CROSS-REFERENCE TO RELATED APPLICATIONS

The present application is a national phase entry under 35 U.S.C. § 371 of International Application No. PCT/EP2020/054955 filed Feb. 26, 2020, published in English, which claims priority from German Application No. 10 2019 104 795.1 filed Feb. 26, 2019, the disclosures of which are incorporated herein by reference.

FIELD OF THE INVENTION

The present description relates in general to the technical field of aviation. In particular, the description relates to a device for producing a flight plan for lightweight aircraft. Furthermore, the description relates to a system or a composite made of such a device and an aircraft, in particular an unmanned and high-altitude aircraft.

BACKGROUND OF THE INVENTION

Aircraft are fundamentally subject to high safety requirements. These safety requirements relate both to the operation of the aircraft as such and also the environment of the aircraft including possible effects of the aircraft on the environment and in particular on the Earth's surface.

To achieve and/or verify a certain amount of operational reliability, an aircraft and its components can be inspected for their operational reliability and/or failure probability before use. The failure probability of the overall system of the aircraft can be influenced in this case in that certain components are kept ready redundantly. An aircraft is considered sufficiently reliable from a defined value of the failure probability.

However, if an aircraft is only operational for very restricted operating conditions, for example, because of the structural and functional design of the aircraft, high demands are placed on the strategic and operational flight planning.

Strategic flight planning is understood in the present case to mean that it relates to questions of the location and time planning with respect to carrying out a flight before beginning the flight. Strategic flight planning can be referred to as flight-preparatory flight planning. In contrast, operational flight planning relates to questions during the flight and permits dynamic engagement in the performance of the flight during the flight and/or recognizing imminent conflicts along a planned flight route and possibly avoiding them. Operational flight planning can be referred to as flight-accompanying flight planning.

SUMMARY OF THE INVENTION

It can be considered to be an object of the invention to simplify the flight-preparatory flight planning for aircraft for high altitudes (so-called high-altitude pseudo satellites, HAPS), in particular for aircraft having large wingspan and low weight and also low power consumption.

This object is achieved by the subject matter of the independent claim. Further embodiments result from the dependent claims and from the following description.

According to one aspect, a device is specified for producing a flight plan for lightweight aircraft, in particular for lightweight aircraft for high altitudes. The device comprises a first interface, a second interface, and a processing unit. The first interface is configured to receive aircraft data relating to the lightweight aircraft, wherein the aircraft data contain at least flight properties and functions of the lightweight aircraft. The second interface is configured to receive weather data from a weather information source, wherein the weather data contain at least weather data from the past and contain at least air movements in an altitude profile between a maximum altitude of the lightweight aircraft and the Earth's surface. The processing unit is configured, inter alia, to compare the aircraft data to the weather data and to ascertain whether the lightweight aircraft is manoeuvrable in the case of the received weather data and on the basis of the aircraft data. It is possible for this step to use additional data about the aircraft and its cargo and/or planning data with respect to a flight route (inter alia, starting point, flight route, destination point or landing point).

A lightweight aircraft in conjunction with this description is understood in particular as an unmanned aircraft having a weight less than 200 kg, preferably less than 150 kg, furthermore preferably less than 100 kg. The specifications about the weight relate in particular in each case to the maximum weight during the operation of the lightweight aircraft. The lightweight aircraft is distinguished by a wingspan of the wings greater than 10 m, preferably greater than 15 m, furthermore preferably greater than 20 m. The weight of the lightweight aircraft is thus very low in relation to the wingspan. A low ratio between weight in relation to the wingspan can also be achieved, of course, with higher values for weight and wingspan. For example, the aircraft can comprise 400 kg at a correspondingly high wingspan of greater than 50 m or even greater than 70 m. Of course, such an aircraft is also to be understood as a lightweight aircraft. The lightweight aircraft can thus be designed so that it can manage a usage duration without intermediate landing on the Earth's surface or another flying platform over multiple days, for example, more than 5, more than 10, or even more than 20 days up to 100 or 200 days. It is also conceivable that the lightweight aircraft accesses renewable energy sources or solar radiation to generate energy for the operation of the lightweight aircraft and thus to enable the long uninterrupted operating duration.

An aircraft in the meaning of this description can in particular be an aircraft having the above-described boundary conditions relating to weight, wingspan, and suitability for the mentioned altitude. An aircraft can generally be a flying object, however, for example, one which is designed for the transportation of a load or a so-called lighter-than-air flying object. For example, an aircraft can also be understood as a flying object having mission components for executing missions. Examples of a mission component are: environmental sensors (for example, electro-optical sensors, gas sensors, particle sensors, temperature sensors), transceiver units for radio or radar signals, target marking units, etc.

The lightweight aircraft comprises a drive unit, for example, at least one propeller and motors coupled thereto. The motors are preferably electrically operated. To provide energy to the motors, a fuel cell or rechargeable batteries can be provided on board the lightweight aircraft. The lightweight aircraft can also comprise a photovoltaic system to provide electrical energy based on the light of the sun.

The lightweight aircraft can in particular be provided and suitable for flight operations in the stratosphere. The stratosphere extends between an altitude of 11 to 50 km above sea level. The lightweight aircraft can fly, for example, in the lower third of the stratosphere, i.e., between 11 and 25 km above sea level.

The maximum altitude of the lightweight aircraft can be a construction-related maximum altitude or a mission-linked maximum altitude. The mission-linked maximum altitude is a maximum altitude predetermined or provided for a mission.

The data which are received via the first interface describe and/or relate to the status of the lightweight aircraft. Items of status information are in particular those items of information which change during the operating time of the aircraft, for example, velocity, movement direction, position, charge level of the batteries. In contrast to these variable items of status information, items of configuration information are preferably not transmitted to the device. Such items of configuration information are, for example, the battery capacity, the resistance coefficient, the mass of the payload.

The lightweight aircraft is manoeuvrable if it can maintain a desired movement direction or general flight trajectory in spite of environmental or weather influences using active and passive systems. In other words, the manoeuvrability results from the lightweight aircraft being able to withstand the environmental or weather influences and not being driven away from a course or corridor to be maintained and also not receiving structural or functional damage therefrom. Active systems are in particular the drive of the lightweight aircraft. Passive systems are in particular control flaps or control surfaces on the lightweight aircraft, in particular on its fuselage or its wings.

The device described here is thus suitable in particular for flight-preparatory flight planning of lightweight aircraft for use at high altitudes. In particular, on the basis of the information about the lightweight aircraft and the weather data, flight-preparatory planning may be performed. Lightweight aircraft to which reference is made here can only reach or leave their operational altitude under certain conditions. The device makes it possible to determine time periods at which the desired or required conditions exist with a high degree of probability. Consequently, the device contributes to defining in the first place meaningful operating times for such a lightweight aircraft. Furthermore, the device described here can be used to reduce a workload of the operator by being able to recognize early whether a potential conflict between flight route and environmental conditions can exist with which associated probability of occurrence within the next operating hours or for instance the notified season (time of year of time of day) at a certain location in the world. The resulting findings from the study of the environmental conditions can also be used for an autonomous or partially autonomous flight mode of the aircraft.

According to one embodiment, the processing unit is configured to prepare a model of the lightweight aircraft based on the aircraft data and to simulate a flight on the basis of the weather data in a predetermined spatial region using this model, wherein the lightweight aircraft follows a predeterminable flight trajectory.

The processing unit simulates a flight from a starting point linked to a starting point in time to a destination point linked to a destination point in time. The received weather data and a waypoint sequence or in general a command sequence which defines a flight route are used as the basis for this purpose. The starting point and the destination point relate to coordinates or position specifications on or above the Earth's surface.

The simulation enables it to be established whether the lightweight aircraft can undertake a flight under the given weather conditions or general environmental conditions and/or is manoeuvrable during the flight. It can thus be ascertained whether the lightweight aircraft can reach the destination point at all, and if so, whether the destination point can also be reached at the predetermined destination point in time.

It is of course also possible that, starting from a destination point in time and a destination point, the device can also determine on the basis of the weather data when the lightweight aircraft must leave the starting point and which route it must fly. This prediction can be made on the basis of the weather data diagram of the past and/or on the basis of current weather predictions. The weather predictions can in this case likewise be obtained from the weather information source.

The simulation can show in particular how the weather conditions influence the flight of the lightweight aircraft. In other words, the aircraft performances and flight properties are offset in relation to the atmospheric conditions.

The model of the lightweight aircraft is produced in particular by using static properties of the lightweight aircraft (for example, weight, spatial dimensions, resistance coefficient, etc.) and variable properties of the lightweight aircraft (for example, available energy for the drive unit, parameters relating to the structural integrity of the lightweight aircraft, restrictions of the drive power, etc.). With the aid of these properties, it can be ascertained whether the lightweight aircraft can structurally withstand certain weather conditions and is manoeuvrable.

Based on the data received via the first interface, a model or an image of the aircraft can be produced or updated. This model can be referred to as a digital twin. The model can be used to simulate and predict the behaviour of the aircraft under various weather conditions.

For example, the model can be used to estimate the aircraft position during a flight and in the event of loss or restriction of the data connection to the aircraft. For this purpose, the last known position is used as the starting point. In addition, the planned or predetermined flight route is known. Using the last known position and the planned flight route, an estimated location region (and also charge level, power consumption, etc.) of the aircraft can be ascertained by employing the model of the aircraft, the weather data, and the weather uncertainty.

The model of the aircraft can also be updated if, for example, the operating parameters of the aircraft change, i.e., the above-mentioned items of status information (for example, accelerated flight, operation with or without payload mode, with or without switched-on position lights, etc.) or items of configuration information (for example, charge level, structural degradation, etc.) change. This updated model can then be used for a better estimation of the behaviour of the aircraft.

The model of the aircraft can be used to acquire the behaviour change of the aircraft with increasing operating duration and to refine the model based on these changes. This can enhance the accuracy of a prediction based on the model.

The model of the lightweight aircraft can be based, for example, on predetermined data and on acquired data of a lightweight aircraft in use. The data of the lightweight aircraft in use can be acquired using sensors and transmitted via the first interface to the device. The entirety of these sensors can also be referred to as telemetry data acquisition.

Overall, the processing unit can thus compare the aircraft data not only to the weather data, but rather additionally to planning data of a flight route.

The weather data contain, for example, measurement data of weather stations, predictions, measurement data acquired independently by the aircraft. Weather data can be in particular vertical profiles. A vertical profile contains, for example, items of information about wind direction, wind speed, temperature, dew point, ambient humidity above a point of the Earth's surface at various or multiple altitude or pressure increments.

According to a further embodiment, the processing unit is configured to compile weather data from a plurality of years in a weather data diagram and to compare the aircraft data and capabilities with the compiled weather data diagram.

In order to obtain informative weather data, the weather data from multiple or many years are compiled into a single weather data diagram. Cyclically repeating whether phenomena in a certain region of the world having a certain statistical significance can thus be established.

It has been established that this procedure forms a comparatively reliable basis for making a prediction as to the manoeuvrability of a lightweight aircraft. This procedure can overall increase the probability of successfully completing a mission of the lightweight aircraft.

For example, the weather data diagram can be produced for the entirety of one year, specifically based on the weather data of multiple preceding years, for example, the last ten or more years. The weather data of 50 years can be used. It is conceivable to use the weather data from all years for which weather data exists.

The weather data of the preceding years are entered into the weather data diagram for every day of the year beginning with the first day and ending with the last day of the year. Consequently, those days which, from a historical viewpoint, did not bring with them any restriction of the manoeuvrability beyond a certain extent for the operation of the lightweight aircraft can be ascertained.

Which days brought with them a restriction of the manoeuvrability also depends on the properties of the lightweight aircraft. If, therefore, only the weather data are considered, this does not in itself indicate anything about the restriction of manoeuvrability. If, however, the properties of the lightweight aircraft are also included, the device described here can indicate whether on certain days or at certain times of year it is advisable or not advisable to operate the lightweight aircraft at a certain location.

Statistical statements about the weather data can be obtained, for example, in that according to the Monte Carlo approach, the simulation is performed multiple times via seasonally relevant weather data (these can be individual, multiple, or all of the weather parameters mentioned in conjunction with the device described here) and the statistical mean of the result is ascertained. Alternatively or additionally, averages of said weather parameters at a specific location (or region) at a specific point in time (or time frame) and the standard deviation thereof can be ascertained and the simulation can be based thereon when the aircraft data are compared to the weather data. This comparison can take place in the context of a simulation, in which once the nominal weather parameters, once the weather parameters minus the standard deviation, and once the weather data plus the standard deviation are used. These approaches are advantageously suitable for making statements on the seasonal suitability of the weather for and/or on the influence of the weather on the operation of the aircraft and/or for ascertaining an optimal route (route having the probable least negative effects on the aircraft due to the weather) in consideration of the weather data.

In the comparison of the weather data to the aircraft data, two groups of value parameters and the common influence thereof on the behaviour of the aircraft can be used. The first group of value parameters relates to the weather data and the statistical statements derived therefrom. The second group relates to the aircraft data or the properties of the aircraft, for example, behaviour of the batteries, altitude, motor loads. The comparison of weather data to the comparison of aircraft data or aircraft properties can be performed for various scenarios and/or pairs in these groups of value parameters. For example, a prognosis for the behaviour of the aircraft can be produced starting from specific weather data, however, with variable values for the aircraft data or properties. The weather data of another possible weather scenario can then be used to be simulated using the variable values for the aircraft data or properties.

An advance warning time for the engagement of a human operator can be increased via this estimation of the behaviour of the aircraft in consideration of the inaccuracy of the weather data and in addition in consideration of the variability of the aircraft data or properties.

The various possible scenarios thus obtained for a behaviour of the aircraft represent a probability space of the expected behaviour. This probability space can be used to ascertain when an engagement of a human operator is necessary. The processing unit can be designed to control the aircraft as long as previously defined limits for the possible behaviour of the aircraft (for example, an air corridor) are maintained. A continuous verification can also be carried out for this purpose that the prediction, for example, guarantees the maintenance of a specific parameter corridor (for example, coordinates) an hour or longer in the future under all probable cases of fault (motor failure, battery failure, aerodynamic change) and weather scenarios (unexpected turbulence with influence on efficiencies, deviations from the prediction, etc.) and if it is not maintained in one of the cases, for example, a new automatic airspace request or involvement of the human operator has to take place.

According to a further embodiment, the processing unit is configured to ascertain and output a manoeuvrability of the lightweight aircraft for various altitudes based on the weather data diagram.

This means that proceeding from the weather data diagram, a flight corridor having minimal altitude and/or maximal altitude can be ascertained, in which the lightweight aircraft is manoeuvrable and also remains manoeuvrable over the time frame of the mission.

Suitable points in time for an ascent or descent of the lightweight aircraft can thus also be ascertained.

Furthermore, it is possible to ascertain permissible and technically and operatively possible changes of the altitude during the operation of the lightweight aircraft, without restricting the manoeuvrability of the lightweight aircraft beyond a certain extent.

It can be necessary, for example, for the lightweight aircraft to reduce its altitude during the night, in order to require less energy for the drive of the lightweight aircraft because of the denser air at the lower altitude. The weather data diagram shows whether and to what extent the lightweight aircraft can reduce its altitude. The solar radiation is absent during the night, so that it cannot be used as an energy source. The lightweight aircraft thus has to manage using the energy available on board. A corresponding altitude can be selected in dependence on the available energy and also the duration of the night (for example, because of the geographic position and/or because of seasonal variations of the day-night duration).

According to a further embodiment, the weather data contain at least one parameter from the following group of parameters: wind speed in relation to one or more altitude values above sea level, wind direction, precipitation quantity, clouds, vertical wind speed. The weather data can also contain secondarily ascertained values or risk factors, for example, turbulence probabilities, ice formation, wave formation/downwash.

In particular lightweight aircraft can be sufficiently restricted in the operating properties thereof by precipitation such as rain or snow that it is not possible to reach a target altitude at all. The ascent and/or the landing can only be executed at a precipitation-free or nearly precipitation-free time. The information about the precipitation quantity is thus helpful.

Lightweight aircraft can also be designed so that they are structurally suitable not at all or only to a limited extent for flying through clouds. Furthermore, it can be reasonable or necessary for the ascent for the surface winds not to exceed a speed predetermined in dependence on the properties of the lightweight aircraft.

The wind speed can be ascertained for multiple altitude positions or air layers. This means that the altitude values above sea level each relate to a value range. A distance between the maximum altitude of the aircraft and the Earth's surface can be divided into a plurality of altitude positions (which can also be referred to as air layer, geographical altitude, pressure altitude, or pressure increment) and it can be ascertained for each altitude position whether the aircraft is manoeuvrable under the weather conditions of said altitude position.

The distance between the Earth's surface and maximum or provided altitude of the aircraft can be allocated into multiple layers (altitude positions or pressure increments). The distance can be allocated uniformly into multiple altitude positions, i.e., each altitude position is of equal height. However, it is also conceivable that the altitude positions are allocated so that the weather conditions in an altitude position are homogeneous or nearly homogeneous. For example, if there are air movements in various directions and/or at various speeds between the Earth's surface and the aircraft, the respective altitude positions can be defined so that the wind direction and/or the wind speed do not differ or do not substantially differ from one another within one altitude position.

The influence on the manoeuvrability of the aircraft can be ascertained individually for each altitude position.

The wind direction together with the wind speed can be related to the flight properties of the lightweight aircraft in order to ascertain whether the lightweight aircraft can maintain a desired or predetermined flight route under the given wind conditions or wind conditions to be expected (wind direction in combination with the wind speed). The flight properties of the lightweight aircraft which are used include in particular a maximum achievable flight speed, which results from an angle of attack and an energy availability. The flight route can in all embodiments also be a flight corridor, in which the lightweight aircraft can move.

It can be ascertained from the wind conditions and the flight properties of the lightweight aircraft how far the lightweight aircraft is driven from a provided or actual flight path and whether the lightweight aircraft is still located within the permitted or statistically probable flight corridor under these conditions.

Overall, the approach described here enables long-term strategic flight planning for a lightweight aircraft and thus substantially contributes to improving the operational reliability of a lightweight aircraft.

According to a further embodiment, the device is configured to receive via the second interface, together with the weather data, a weather prediction from the weather information source in repeating reception steps, wherein the weather prediction relates at least to air movements in an altitude profile between a maximum altitude of the lightweight aircraft and the Earth's surface.

Statistical analyses of preceding weather conditions can be produced using the appropriate tools and are used as the basis for the strategic flight planning. For the operative flight planning, it is at least helpful to use a weather prediction in order to define a time and location component of the flight planning based on the weather prediction.

Current weather measurements and weather predictions based thereon are provided by weather services (which are referred to herein as a weather information source) at regular intervals. These weather predictions can be used to improve the operative flight planning.

According to a further embodiment, the processing unit is configured to compare the weather predictions from a preceding receiving step to actual weather data from a subsequent receiving step and to ascertain a deviation between the weather predictions from the preceding receiving step and the actual weather data of the subsequent receiving step, in order to determine an uncertainty of the weather prediction therefrom.

The device can be configured to store the received weather data, for example, in a data memory, in which the weather data can be stored in a volatile or non-volatile manner. The processing unit is configured to compare the weather predictions from a preceding receiving step to actual weather data from a subsequent receiving step and to ascertain a deviation between the weather predictions and the later actually occurring weather data. This deviation can be used as a measure of the uncertainty of the weather prediction.

Weather data of a weather prediction are generally subject to a certain level of uncertainty, wherein the extent of the uncertainty is also unknown. In addition to the information about how the predicted weather can act on the lightweight aircraft, the uncertainty of this information can also be relevant to ascertain, for example, how high the probability is that the manoeuvrability of the lightweight aircraft will be impaired in an undesired manner because the weather nonetheless occurs differently than predicted.

The device described herein deals with these uncertainties as follows: for the past, i.e., for weather predictions for preceding time periods, the weather prediction for a point in time is compared to the weather actually existing at this point in time and the deviation between prediction and actual weather is ascertained. After the weather conditions have been acquired in repeating time periods and a prediction is prepared for future time periods, the prediction can be compared to the actual weather then occurring for each of these time periods. The deviation between prediction and occurring weather is ascertained from this comparison. This deviation is a measure of the uncertainty of the weather prediction. Like any prognosis, a weather prediction also contains an uncertainty relating to its accuracy. This accuracy of preceding data can also be extrapolated to the future by the accuracy thereof having been ascertained for preceding weather predictions.

The preceding time periods considered for the ascertainment of the uncertainty of weather predictions can be very short in comparison to the weather data diagrams used for the strategic flight planning. For the weather data diagrams of the strategic flight planning, the weather of multiple years up to multiple decades is used, to be able to make a statement about the weather to be expected with respect to a point in time of the year. This is because, for example, the strategic flight planning has to be carried out with a large time lead, so that a reliable weather prediction so far in the future does not even exist yet. To ascertain the accuracy or uncertainty of a weather prediction for the near future (multiple hours in the future, for example, six, twelve, 18, or 24 hours), in contrast, it can be sufficient to ascertain the uncertainty of the weather prediction over the last few days up to one or two weeks. The uncertainty of the weather prediction is thus a measure of the probability that the actually occurring weather will deviate from the weather prediction.

The comparison of the weather prediction to the actually occurring weather can also contain information about how strongly the actually occurring weather deviated from the weather prediction. For a predicted wind speed of 30 km/h and an actual later wind speed of 25 km/h, the deviation would then be 5 km/h. This enables a quantitative statement about the possible influencing of the lightweight aircraft by the uncertainty of the weather prediction.

According to a further aspect, a system is specified for producing a flight plan for lightweight aircraft and for operating such a lightweight aircraft. The system comprises a lightweight aircraft having a position ascertainment unit and a telemetry data acquisition unit and also a device as described above and hereafter. The position ascertainment unit is configured to determine a position of the lightweight aircraft with respect to the Earth's surface and to transmit it to the device. The telemetry data acquisition unit is configured to acquire parameters of the lightweight aircraft and transmit them to the device. The device is configured to ascertain whether the lightweight aircraft is manoeuvrable based on the transmitted position of the lightweight aircraft and the parameters of the lightweight aircraft and also the weather data.

The system contains in particular a lightweight aircraft as was defined further above with reference to the device.

The lightweight aircraft comprises a telemetry data acquisition unit. The telemetry data acquisition unit comprises sensors to acquire items of status information of the lightweight aircraft. These items of status information can then be transmitted to the device either immediately or subsequently to a processing step.

For example, sensors can be arranged in the lightweight aircraft to establish the structural integrity of the aircraft or possibly to identify fractures on the fuselage and transmit them to the device.

The geographical position, for example, as a normal above the Earth's surface, can be established by the position ascertainment unit. The position ascertainment unit is, for example, a receiver for position signals from a satellite-supported positioning system such as GPS or Galileo. Such a position ascertainment unit can also ascertain the altitude above the Earth's surface.

In this system, the device can thus be used to monitor the lightweight aircraft during the flight and to simplify operational flight planning by executing a continuous comparison of the items of status information about the lightweight aircraft and its properties to the weather data and possibly to the weather prediction. The flight route can then be dynamically adapted, for example, to move the lightweight aircraft so that it remains manoeuvrable. For example, the flight route can be selected or changed so that the lightweight aircraft avoids or flies around regions or altitude positions having disadvantageous weather conditions. However, it is also conceivable that the lightweight aircraft uses regions or altitude positions which are advantageous for reaching the destination.

According to one embodiment, the telemetry data acquisition unit comprises a plurality of sensors, wherein each sensor of the plurality of sensors is designed to acquire one parameter of the lightweight aircraft and wherein the parameters of the lightweight aircraft are selected from the following group of parameters: structural integrity of a fuselage of the lightweight aircraft, operability of control flaps (telemetry permits an estimation of the dynamic efficiency), drive power, efficiency of the energy generators, charge level of the energy accumulators, power consumption by consumers.

The acquired parameters are used to obtain the most complete possible picture of the status of the lightweight aircraft.

In other words, one aspect of the present disclosure can be described as follows: the device described herein uses parameters relating to the aircraft and/or elements on board the aircraft and also historical weather data and possibly weather predictions to ascertain the behaviour of the aircraft along a waypoint sequence and under the influence of said weather data. The parameters relating to the aircraft and/or elements on board the aircraft can contain, on the one hand, predetermined or predeterminable parameters and, on the other hand, current parameters of the aircraft and/or the elements on board the aircraft acquired by sensors, and can also be combinations of these two types of parameters. The status of the aircraft and components thereof can be monitored by acquiring items of status information continuously or at predetermined time intervals and transmitting them to the device, to then be used therein for the determination of a possible or probable movement corridor. These items of status information can be applied to the digital model of the aircraft. The behaviour of the digital model can be used continuously or at time intervals for predicting the probable movement corridor. This prediction of the behaviour of the digital model can then be compared to the behaviour of the aircraft. Deviations between them can be used to adapt the parameters of the digital model so that the predictions by means of the digital model are closer to the behaviour of the real aircraft. An iterative approach is thus implemented, which enables an improved prediction of the behaviour of an aircraft under the influence of said weather data.

According to a further aspect, a method is specified for producing a flight plan for lightweight aircraft. The method is executed using a device as described herein. The method comprises the following steps: inputting aircraft data relating to the lightweight aircraft, wherein the aircraft data contain at least flight properties and functions of the lightweight aircraft; receiving weather data from a weather information source, wherein the weather data contain at least weather data from the past and contain at least air movements in an altitude profile between a maximum altitude of the lightweight aircraft and the Earth's surface; comparing the aircraft data to the weather data; and ascertaining whether the lightweight aircraft is manoeuvrable in the case of the received weather data and on the basis of the aircraft data.

The steps of the method preferably correspond to the functions which were described above with reference to the device. These functions will not be repeated at this point.

BRIEF DESCRIPTION OF THE FIGURES

Exemplary embodiments of the invention are described in greater detail hereafter on the basis of the appended drawings. The illustrations are schematic and are not to scale. Identical reference signs refer to identical or similar elements. In the figures.

DETAILED DESCRIPTION OF EXEMPLARY EMBODIMENTS

Figure 1:
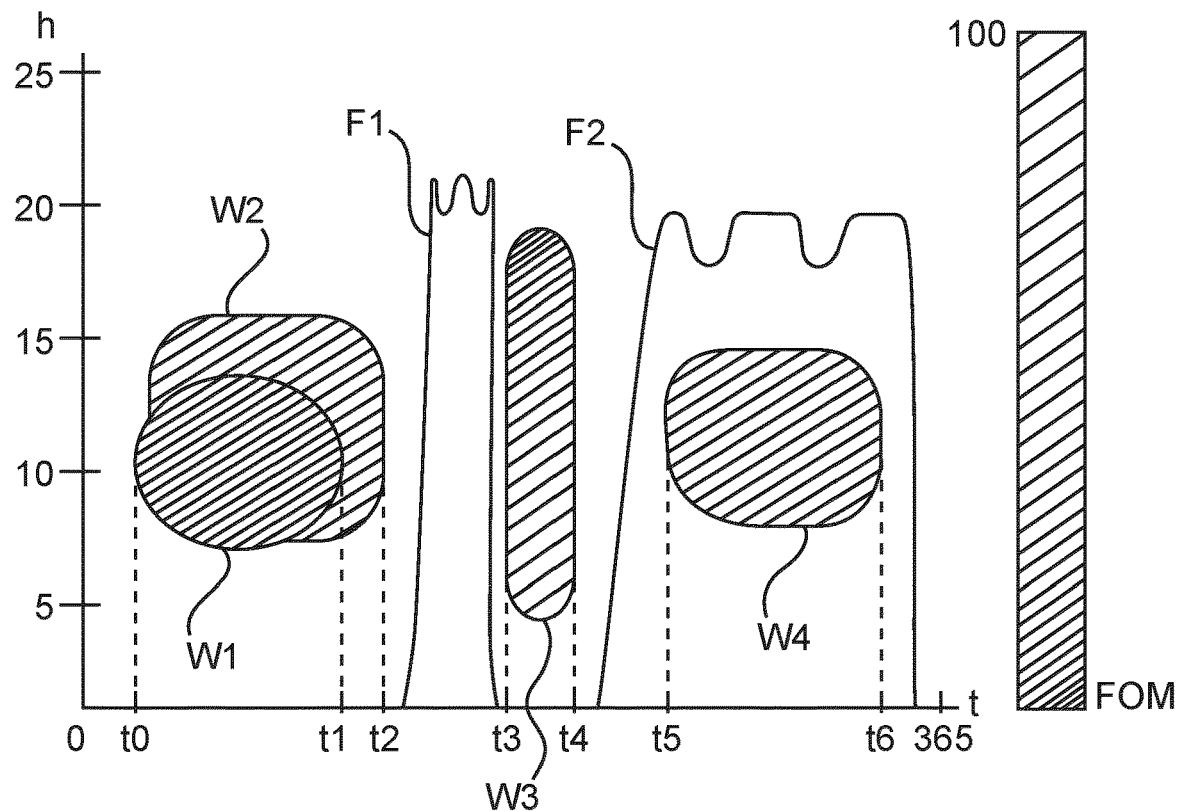
FIG. 1 shows a schematic illustration of a weather data diagram.

FIG. 1 shows an exemplary weather data diagram, which indicates the possible influence of the weather conditions on the manoeuvrability of a lightweight aircraft. In principle, the influence of the weather conditions is quantitatively indicated by the density of the shading lines (spacing of adjacent shading lines), as are plotted on the right side of the scale from 0 to 100. This scale describes the manoeuvrability from "not manoeuvrable at all" (value 0) to "complete operational freedom" (value 100). The manoeuvrability can also be referred to as freedom to operate (FOM).

The influence of the weather conditions on the manoeuvrability of the lightweight aircraft is shown on the left in the weather data diagram next to the scale relating to the manoeuvrability. The altitude h (in kilometres) above the Earth's surface is plotted on the vertical axis and the days t of a year beginning with 1 January up to 31 December are plotted on the horizontal axis.

Weather data are typically contained in the entire weather data diagram. Only four isolated weather conditions W1, W2, W3, and W4 are shown for illustration purposes in FIG. 1, in order to demonstrate how the weather data diagram is to be read.

The weather condition W1 is distinguished by very dense shading and expresses a disadvantageous effect on the manoeuvrability of the lightweight aircraft. Manoeuvrability is almost not provided. The weather condition W1 exists in the first third of the year between the points in time t0 and t1 at an altitude between approximately 8000 m and 13 000 m.

The weather condition W2 also adjoins above (with respect to the altitude) W1 in the first third of the year. The weather condition W2 lasts somewhat longer in time than the weather condition W1. W2 lasts from t0 to t2 and extends from above approximately 13 000 m up to approximately 16 000 m. Chronologically after the weather condition W1 has subsided, i.e., from the point in time t1, the weather condition W2 extends down to an altitude of approximately 7000 m and lasts until the point in time t2.

A phase of calm weather chronologically follows the weather conditions W1 and W2, which does not or almost does not disadvantageously impair the manoeuvrability of the lightweight aircraft over the entire altitude. This time period lasts from the point in time t2 up to the point in time t3. In this phase, a lightweight aircraft can be operated over the entire altitude spectrum from sea level up to an altitude of 25 km.

An exemplary flight plan is identified by F1. It is obvious that the lightweight aircraft starts on the Earth's surface, continuously gains altitude until it has reached an altitude of approximately 20 km. In the course of time, the altitude varies slightly until the lightweight aircraft lands again before the point in time t3.

The advantage of the approach described herein is already recognizable here. Based on the weather data from a plurality of preceding years, it was recognized for a specific location in the weather data diagram that almost no impairment of the manoeuvrability of the lightweight aircraft is to be expected between the points in time t2 and t3. A flight can be planned accordingly for this time frame.

Beginning with the point in time t3, weather conditions begin between approximately 4000 m and 18 000 m, which disadvantageously influence the manoeuvrability of the lightweight aircraft moderately to strongly, wherein the weather conditions comparatively worsen from 12 000 m upwards.

It can be derived therefrom that the starting or landing of the lightweight aircraft is not very advisable between the points in time t3 and t4. However, it is recognizable that proceeding from the typical altitude of 20 km or higher, it is possible to fly over the bad weather region, if the lightweight aircraft does not also have to sink below 18 000 m at night. It is conceivable that the flight F1 begins between the points in time t2 and t3 and ends between the points in time t4 and t5. It is to be noted in this case that the lightweight aircraft reaches its altitude of above 18 000 m before the point in time t3, remains continuously at least at this altitude up to at least the point in time t4, and then lands again before the point in time t5. In other words, the weather condition W3 is flown over both chronologically and also positionally.

This is also shown by way of example with the flight F2 and the weather condition W4. The flight F2 begins between the points in time t4 and t5, the lightweight aircraft gains altitude up to approximately 17 to 19 km and remains at this altitude or in an altitude layer between 17 and 19 km after the point in time t6. During the flight F2, the weather condition W4 is flown over chronologically and positionally, because the weather condition W4 extends from the point in time t5 up to the point in time t6 and from approximately 7000 m to 13 000 m.

The wind speed, the clouds, and also specifications about the precipitation are incorporated into the representation of the weather conditions. The weather conditions indicate when and where a lightweight aircraft having known properties and capabilities is negatively affected by the weather in such a way that its manoeuvrability is no longer provided. Other specifications about the weather can also be incorporated, for example, the temperature.

The weather data diagram in FIG. 1 shows the weather conditions at a specific location. These weather data are useful and helpful if the lightweight aircraft remains nearly static at one location or in a small local area during the flight. In contrast, if the position of the lightweight aircraft changes significantly, weather data of the position then assumed are thus to be considered.

It is also possible to produce a prediction of the influence of weather conditions, in particular wind speeds, on the position of the lightweight aircraft if the lightweight aircraft has to traverse upward or downward through a comparatively narrow altitude strip having strong winds. If an air layer having strong winds between otherwise calm air layers is located, for example, between 8000 m and 10 000 m, it is possible to produce a prognosis of how these winds will influence the lightweight aircraft with respect to its position (for example, lateral displacement, so-called drift), before the lightweight aircraft has traversed said altitude strip.

Based on the items of information about the aircraft, a digital model thereof can be produced. The digital model can then be placed in a weather scenario to ascertain the effects of the weather on the digital model of the lightweight aircraft.

Figure 2:
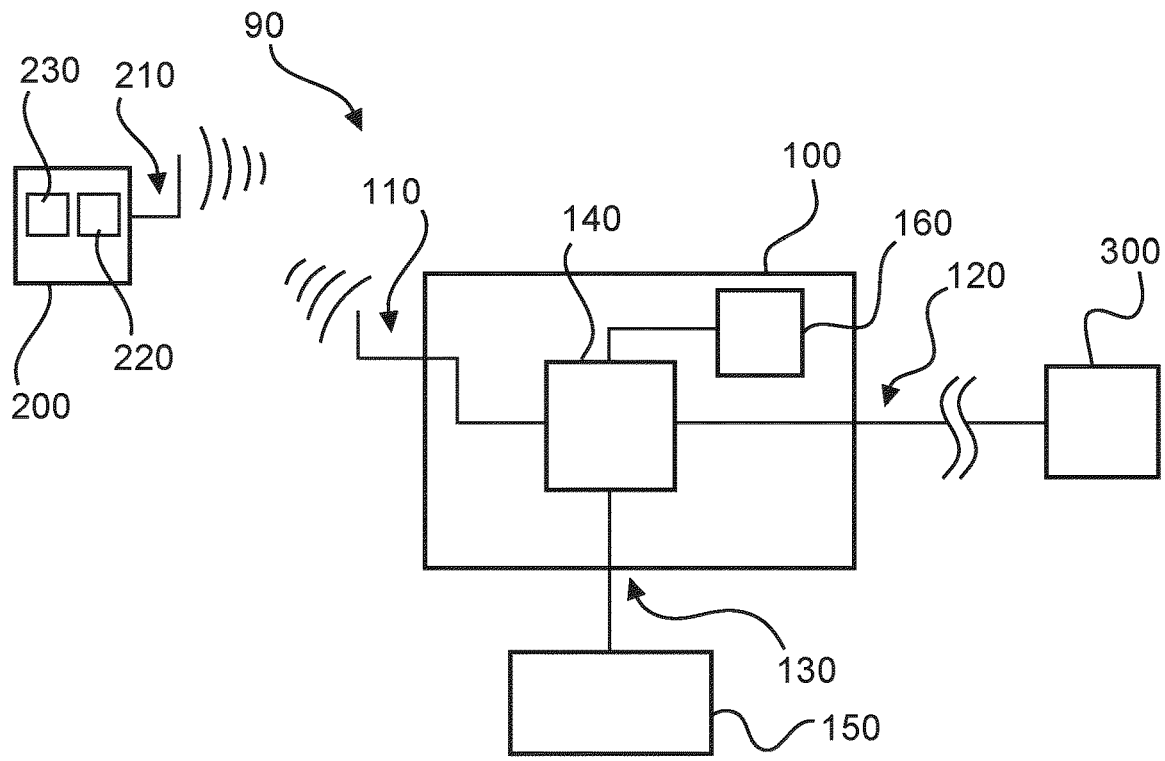
FIG. 2 shows a schematic illustration of a device according to one exemplary embodiment.

FIG. 2 shows a schematic illustration of a system 90 for producing a flight plan for lightweight aircraft, in particular for high altitudes. The system 90 comprises a device 100 for producing a flight plan for lightweight aircraft and a lightweight aircraft 200.

The device 100 comprises a first interface 110, a second interface 120, and a third interface 130. Furthermore, the device 100 comprises a processing unit 140 and a data memory 160.

The first interface 110 and the second interface 120 are connected to the processing unit 140 to be able to exchange data. The processing unit 140 can be a conventional computer or a processor (CPU). The processing unit 140 is prepared and configured in such a way that it executes the functions and steps described herein.

A wireless connection to an interface 210 of the lightweight aircraft 200 can be established via the first interface 110. Data can be transmitted bidirectionally or unidirectionally via this connection. The lightweight aircraft 200 comprises a position ascertainment unit 220. The position ascertainment unit 220 is, for example, a GPS receiver and is configured to determine a position of the aircraft 200. Position data and other data relating to the lightweight aircraft can be transmitted via the connection between the interface 210 and the first interface 110. The interface 210 and the interface 110 can be antennas, for example.

The lightweight aircraft 200 also comprises a telemetry data acquisition unit 230. The telemetry data acquisition unit 230 is, for example, a group of a plurality of sensors, which are arranged on the fuselage and other components (drive, energy accumulator, control flaps, etc.) of the lightweight aircraft and also possible payloads, so that items of information about the lightweight aircraft, its components, and the payload can be acquired. The telemetry data acquisition unit can also contain one or more vibration sensors to acquire vibrations of the aircraft. The items of information which the sensors acquire are also transmitted by means of the interface 210 to the interface 110 of the device 100.

The sensors are attached in a suitable manner to the lightweight aircraft, its components, and the payload. The sensors can transmit the physical parameters acquired thereby wirelessly or via a wired connection to a transmission unit (not shown). The transmission unit prepares the data (for example, by means of analog-to-digital conversion) and relays them to the interface 210, where the data are then transmitted wirelessly to the first interface 110.

The second interface 120 is used to receive data from a weather information source 300. The second interface 120 can be, for example, a network connection to reach the weather information source 300 via an interconnected network (for example, the Internet).

Weather data of the past and weather predictions can be retrieved from the weather information source. The weather data diagram shown in FIG. 1 is produced from the weather data of the past. This weather data diagram is primarily used for strategic flight planning. Weather predictions, in contrast, are predominantly used for the operational flight planning of a lightweight aircraft already in use.

The third interface 130 is used to connect and control a display unit 150. The display unit 150 can also be designed as part of the device 100. The display unit can be a monitor or a display screen, on which a detail of a map, the position of the aircraft is shown.

The weather data diagram from FIG. 1 can be displayed on the display unit. To simplify the operational flight planning, the current weather and/or a weather prediction can be displayed on the display unit. The display can be designed, for example, so that it displays a map detail which covers the flight path for a specific time period. This specific time period can be, for example, the time frame at which updated weather data are expected. It can also be the time frame which is between two updating procedures of the weather data.

The weather data of the current altitude of the lightweight aircraft can be displayed on the display unit. If the flight plan provides that the altitude changes, the weather for the altitude planned there can be indicated for every position on the map.

The data memory 160 is used to store weather data and keep them ready for the later statistical analysis. The data memory can be, for example, a hard drive.

The processing unit 140 can be a processor which is configured to execute the steps described herein in order to assist the strategic and/or the operational flight planning. For example, the processing unit 140 is a computer or a part of a computer which executes instructions to execute the functions described herein.

Figure 3:
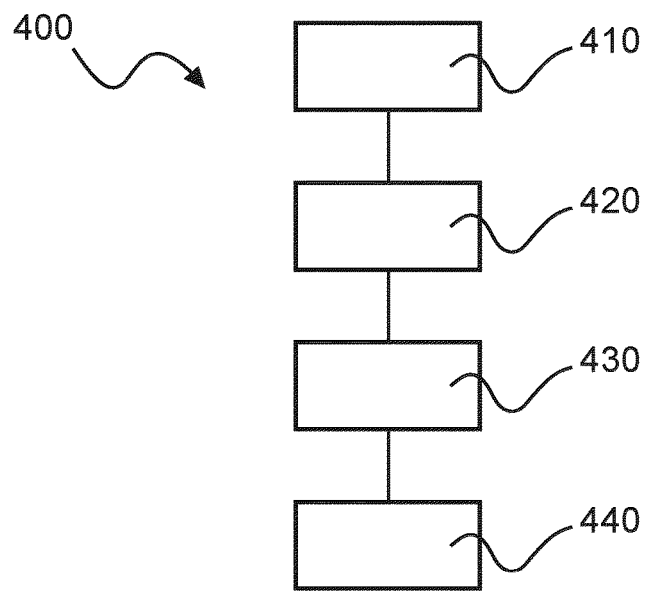
FIG. 3 shows a schematic illustration of a method according to one exemplary embodiment.

FIG. 3 shows a method 400 for producing a flight plan for lightweight aircraft 200, in particular for high altitudes. The method comprises the following steps: in a first step 410, inputting aircraft data relating to the lightweight aircraft 200, wherein the aircraft data at least contain flight properties and functions of the lightweight aircraft; in a second step 420, receiving weather data from a weather information source 300, wherein the weather data at least contain weather data from the past and at least contain air movements in an altitude profile between a maximum altitude of the lightweight aircraft and the Earth's surface; in a third step 430, comparing the aircraft data to the weather data; and in a fourth step 440, ascertaining whether the lightweight aircraft is manoeuvrable in the case of the received weather data and on the basis of the aircraft data.

The steps can also be executed in a different sequence. The numbering specified here does not provide a required sequence. For example, it is possible to execute step 420 before step 410.

Using the method described here and the associated device, it is possible to select a suitable aircraft for a specific time window and a specific location in dependence on the weather data in order to execute a mission. For example, if the historic weather data indicate that a lightweight aircraft cannot withstand the weather conditions for a specific time period, another aircraft can be selected to carry out the corresponding mission.

In particular, it is possible to plan missions of long period early and accompany them operationally. Lightweight aircraft as described herein can be used, for example, for monitoring and reconnaissance flights having a period of multiple days or multiple weeks. The lightweight aircraft is equipped with a corresponding payload in dependence on the mission, for example, with optical cameras, thermal imaging cameras, or other sensors to acquire the environment or the Earth's surface. A lightweight aircraft can also be used in the group with other lightweight aircraft to construct an infrastructure for a telecommunication network and provide terminals on the Earth's surface. Multiple lightweight aircraft can maintain their position nearly statically in the stratosphere and can be connected to one another by means of directional radio or an optical data connection. In addition, a lightweight aircraft can contain a base station of a mobile wireless network as a payload. Terminals on the Earth's surface can establish a wireless connection to the base station. A selected lightweight aircraft can be connected to a terrestrial network infrastructure in order to feed the data of the connections between the lightweight aircraft and the terminals into this terrestrial network or receive the data therefrom and relay them to the terminals at a defined transfer point.

The lightweight aircraft typically have a usage altitude above the air layer in which clouds form and move. Therefore, obtaining electrical energy by means of photovoltaics suggests itself, at least during the day. This energy can be used for the drive and the payload of the lightweight aircraft. Electrical energy can be supplied during the day to a chargeable energy accumulator (accumulator, rechargeable batteries), to also have energy available at night.

Figure 4:
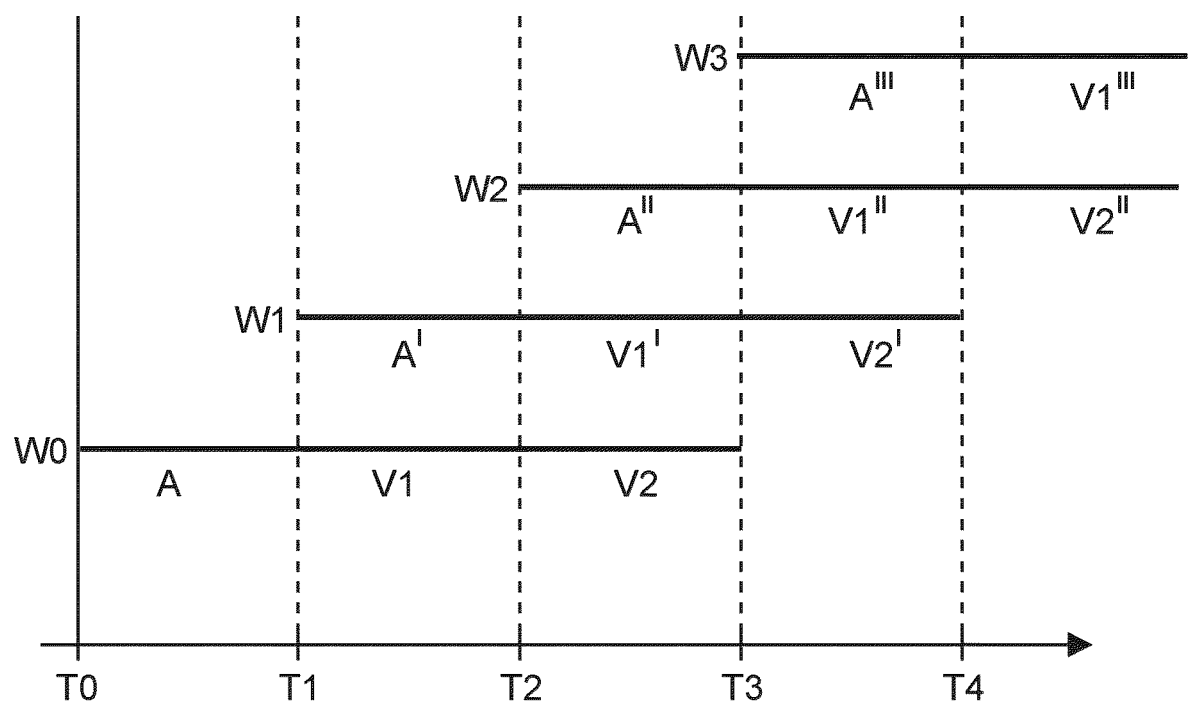
FIG. 4 shows a schematic illustration of cyclically updated weather data and weather predictions.

FIG. 4 schematically shows how weather data and predictions are processed to ascertain the uncertainty of the predictions. These steps are executed by the processing unit 140 by items of weather information received from the weather information source 300 and stored in the data memory 160 being used for this purpose.

At a first point in time T0, weather data W0 are provided by the weather information source 300. These weather data firstly contain an item of information A relating to the current weather and predictions V1 and V2 relating to the future. Although the predictions are shown over only two future cycles in FIG. 2, the predictions can extend over more than the two future cycles.

At a second point in time T1, weather data W1 are provided by the weather information source 300. Like the weather data W0, the weather data W1 also contain an item of information A' relating to the current weather and predictions V1' and V2'. The information A' of the weather data W1 relates to the same time period as the information V1 of the weather data W0.

The accuracy of the prediction in the weather data W0 can thus be determined via a comparison of A' and V1.

It is to be noted that weather data typically depict a past status of the weather conditions even upon the initial availability and can be a few minutes or even hours old. For this reason, it is helpful to know the uncertainty of predictions.

At a third point in time T2, weather data W2 are provided by the weather information source 300. Like the weather data W0 and W1 as well, the weather data W2 also contain an item of information A" relating to the current weather and predictions V1" and V2". The information A" of the weather data W2 relates to the same time period as the items of information V1' of the weather data W1 and V2 of the weather data W0.

The accuracy of the prediction in the weather data W2 can thus be determined via a comparison of A" and V1'. The comparison of A' to V1 and A" to V1' supplies the uncertainty of the short-term weather prediction (looking back one cycle in each case), while the comparison of A" to V2 and A'" to V2' indicates an uncertainty of the longer-term prediction. The uncertainty can thus also be ascertained in dependence on the age of the most recent available weather data. This uncertainty tends to increase the more time has passed since the last update of the weather data. The greater the time interval between the most recent available weather data and the ascertainment of the influence of the predicted weather data on the aircraft, the greater is the uncertainty of the ascertained influence. The processing unit 140 can consider this time interval for the ascertainment of the influence, for example, with a multiplier growing exponentially in dependence on the time interval.

Updated weather data are typically supplied at an interval of 6 hours. As long as these weather data are actually supplied every 6 hours, it can be sufficient to ascertain the deviation between A' and V1, A" and V1', etc. However, it can be reasonable to also ascertain the longer-term deviation over more than one future cycle (i.e., between A" and V2, A'" and V2'), to also be able to ascertain an influence on the aircraft for the case of weather data not arriving.

The weather data are stored in the data memory 160. The deviation between prediction from a past receiving step and actual weather conditions in an immediately subsequent receiving step is continuously ascertained by the processor. To achieve a higher level of statistical significance, this deviation can be ascertained over multiple days or even weeks.

The deviation thus ascertained is the measure of the uncertainty in the computation of the influence of the weather data on an aircraft with otherwise known or predetermined conditions. The uncertainty is used to provide an influence of the weather, which can be computed accurately per se, on the aircraft with a bandwidth of possible deviations. The flight route can thus be provided with a statistically probable movement corridor.

In addition, it is to be noted that "comprising" or "having" does not exclude other elements or steps and "a" or "one" does not exclude a plurality. Furthermore, it is to be noted that features or steps which have been described with reference to one of the above exemplary embodiments can also be used in combination with other features or steps of other above-described exemplary embodiments. Reference signs in the claims are not to be considered a restriction.

LIST OF REFERENCE SIGNS 90 system
100 device for producing a flight plan of an aircraft
110 first interface
120 second interface
130 third interface
140 processing unit
150 display unit
160 data memory
200 aircraft
210 data transmission interface
220 position ascertainment unit
230 telemetry data acquisition unit
300 weather information source

The invention claimed is:

1. A device for producing a flight plan for a lightweight aircraft, the lightweight aircraft having a weight less than 200 kg and a wingspan of the wings greater than 10 m, the device comprising:
　　a first interface configured to receive aircraft data relating to the lightweight aircraft, wherein the aircraft data at least contain flight properties and functions of the lightweight aircraft, wherein the flight properties and functions of the lightweight aircraft comprise one or more of the following parameters of the lightweight aircraft: velocity, movement direction, position, charge level of the batteries, static properties including weight, spatial dimensions, and resistance coefficient, and variable properties including available energy for a drive unit, parameters relating to the structural integrity of the lightweight aircraft, restrictions of the drive power, change of status information including accelerated flight, operation with or without payload mode, and with or without switched-on position lights, and behavior of the aircraft data or the properties of the aircraft including behavior of the batteries, altitude, and motor loads;

a second interface configured to receive weather data from a weather information source, wherein the weather data at least contain weather data from the past and at least contain air movements in an altitude profile between a maximum altitude of the lightweight aircraft and the Earth's surface, wherein the altitude profile is a vertical profile and contains at least information relating to wind direction and wind speed above a point of the Earth's surface at various or multiple altitude or pressure increments; and a processing unit configured to compare the aircraft data to the weather data by predicting a behavior of the lightweight aircraft for specific weather data, and to ascertain whether the lightweight aircraft is maneuverable in the case of the received weather data and on the basis of the aircraft data, wherein the lightweight aircraft is determined to be maneuverable when the aircraft is predicted to maintain a desired movement direction or general a flight trajectory in spite of environmental or weather influences using active and passive systems, wherein the active system is a drive of the lightweight aircraft and the passive systems are control flaps or control surfaces, wherein the processing unit is configured to relate the wind direction and the wind speed to the flight properties of the lightweight aircraft, which include the maximum achievable flight speed resulting from an angle of attack and an energy availability, to ascertain whether the lightweight aircraft is predicted to maintain a desired or predetermined flight route at the wind direction and the wind speed; and wherein the processing unit is configured to generate a flight plan by selecting a suitable aircraft for a specific time window and a specific location on the Earth in dependence of the weather data in order to execute a mission.

2. The device according to claim 1,
wherein the processing unit is configured to produce a model of the lightweight aircraft based on the aircraft data and to simulate a flight on the basis of the weather data in a predetermined spatial region using the model, wherein the lightweight aircraft follows a predeterminable flight trajectory.

3. The device according to claim 1,
wherein the processing unit is configured to compile weather data from a plurality of years into a weather data diagram and to compare the aircraft data with the compiled weather data diagram, wherein the weather data diagram indicates the freedom to operate the lightweight aircraft at different altitudes above the Earth's surface at a specific location for the days of a year.

4. The device according to claim 3,
wherein the processing unit is configured to ascertain and output a maneuverability in terms of the lightweight aircraft being maneuverable for different altitudes on the basis of the weather data diagram.

5. The device according to claim 1,
wherein the weather data contain at least one parameter from the following group of parameters: wind speed in relation to one or more altitude values above sea level, wind direction, precipitation quantity, clouds, vertical wind speed.

6. The device according to claim 1,
wherein the device is configured to receive via the second interface, together with the weather data, a weather prediction from the weather information source in repeating receiving steps, wherein the weather prediction relates at least to air movements in an altitude profile between a maximum altitude of the lightweight aircraft and the Earth's surface.

7. The device according to claim 6,
wherein the processing unit is configured to compare the weather predictions from a preceding receiving step to actual weather data from a subsequent receiving step and to ascertain a deviation between the weather predictions from the preceding receiving step and the actual weather data of the subsequent receiving step in order to determine an uncertainty of the weather prediction therefrom.

8. A system for producing a flight plan for a lightweight aircraft and for operating such a lightweight aircraft, the system comprising:
a lightweight aircraft having a weight less than 200 kg and a wingspan of the wings greater than 10 m and having a position ascertainment unit and a telemetry data acquisition unit;
a device according to claim 1;
wherein the position ascertainment unit is configured to determine a position of the lightweight aircraft with respect to the Earth's surface and transmit the determined position to the device;
wherein the telemetry data acquisition unit is configured to acquire parameters of the lightweight aircraft and transmit them to the device; and
wherein the device is configured to ascertain whether the lightweight aircraft is maneuverable based on the transmitted position of the lightweight aircraft and the parameters of the lightweight aircraft and also the weather data.

9. The system according to claim 8,
wherein the telemetry data acquisition unit comprises a plurality of sensors;
wherein each sensor of the plurality of sensors is configured to acquire a parameter of the lightweight aircraft;
wherein the parameters of the lightweight aircraft are selected from the following group of parameters: structural integrity of a fuselage of the lightweight aircraft, operability of control flaps, drive power, efficiency of the energy generators, charge level of the energy accumulators, power consumption by consumers.

10. A method for producing a flight plan for a lightweight aircraft having a weight less than 200 kg and a wingspan of the wings greater than 10 m and using a device according to claim 1, the method comprising the following steps:
inputting aircraft data relating to the lightweight aircraft, wherein the aircraft data contain at least flight properties and functions of the lightweight aircraft which comprise one or more of the following parameters of the lightweight aircraft: velocity, movement direction, position, charge level of the batteries, static properties including weight, spatial dimensions, and resistance coefficient, and variable properties including available energy for a drive unit, parameters relating to the structural integrity of the lightweight aircraft, restrictions of the drive power, change of status information including accelerated flight, operation with or without payload mode, and with or without switched-on position lights, and behavior of the aircraft data or the properties of the aircraft including behavior of the batteries, altitude, and motor loads;

receiving weather data from a weather information source, wherein the weather data at least contain weather data from the past and at least contain air movements in an altitude profile between a maximum altitude of the lightweight aircraft and the Earth's surface which is a vertical profile and contains at least information relating to wind direction and wind speed above a point of the Earth's surface at various or multiple altitude or pressure increments;

comparing the aircraft data to the weather data by predicting a behavior of the lightweight aircraft for specific weather data; and ascertaining whether the lightweight aircraft is maneuverable in the case of the received weather data and on the basis of the aircraft data, wherein the lightweight aircraft is predicted to be maneuverable when the aircraft is predicted to maintain a desired movement direction or general a flight trajectory in spite of environmental or weather influences using active and passive systems, wherein the active system is a drive of the lightweight aircraft and the passive systems are control flaps or control surfaces;

relating the wind direction and the wind speed to the flight properties of the lightweight aircraft, which include the maximum achievable flight speed resulting from an angle of attack and an energy availability, to ascertain whether the lightweight aircraft is predicted to maintain a desired or predetermined flight route at the wind direction and the wind speed; and generating a flight plan by selecting a suitable aircraft for a specific time window and a specific location on Earth in dependence of the weather data in order to execute a mission.

\* \* \* \* \*